(12) United States Patent
Viard

(10) Patent No.: US 10,903,058 B2
(45) Date of Patent: Jan. 26, 2021

(54) APPARATUS FOR TREATING OBJECTS WITH PLASMA, USE OF THIS APPARATUS AND METHOD OF USING THIS APPARATUS

(71) Applicant: COATING PLASMA INDUSTRIE, Peynier (FR)

(72) Inventor: Jocelyn Viard, Sausset-les-Pins (FR)

(73) Assignee: COATING PLASMA INDUSTRIE, Peynier (FR)

( * ) Notice: Subject to any disclaimer, the term of this patent is extended or adjusted under 35 U.S.C. 154(b) by 317 days.

(21) Appl. No.: 15/560,605

(22) PCT Filed: Mar. 29, 2016

(86) PCT No.: PCT/FR2016/050699
§ 371 (c)(1),
(2) Date: Sep. 22, 2017

(87) PCT Pub. No.: WO2016/156728
PCT Pub. Date: Oct. 6, 2016

(65) Prior Publication Data
US 2018/0053639 A1  Feb. 22, 2018

(30) Foreign Application Priority Data
Mar. 31, 2015 (FR) .................................... 15 52733

(51) Int. Cl.
*H01J 37/32* (2006.01)
*H01L 21/677* (2006.01)
*H01L 21/67* (2006.01)

(52) U.S. Cl.
CPC .. *H01J 37/32889* (2013.01); *H01J 37/32403* (2013.01); *H01J 37/32669* (2013.01);
(Continued)

(58) Field of Classification Search
CPC .................................................. H01J 37/32889
See application file for complete search history.

(56) References Cited

U.S. PATENT DOCUMENTS

| 6,296,735 B1 | 10/2001 | Marxer et al. |
| 8,336,488 B2 | 12/2012 | Chen et al. |

(Continued)

FOREIGN PATENT DOCUMENTS

| DE | 10 2008 019 427 A1 | 10/2009 |
| WO | 2012/052428 A1 | 4/2012 |

(Continued)

OTHER PUBLICATIONS

Non-English International Search Report dated Jun. 10, 2016 for Application No. PCT/FR2016/050699 with an English translation.
Espacenet English abstract of DE 10 2008 019 427 A1.

*Primary Examiner* — Larry W Thrower
(74) *Attorney, Agent, or Firm* — Ladas & Parry LLP; Malcolm J. MacDonald

(57) ABSTRACT

Apparatus for treating the surface of objects with plasma, having: an enclosure; a means for placing this enclosure under vacuum; a zone for storing objects to be treated, which is called the upstream storing zone; a zone for storing treated objects, which is called the downstream storing zone; at least two plasma treatment chambers having a means for injecting an active gas mixture, a means for creating an electrical discharge and a means for confining the plasma to the volume inside the chamber; and a means for transferring between the storing zones and the chambers, characterized in that the transferring means are conveying means defining a conveying direction, and in that the various chambers are placed one behind the other, in the conveying direction, and in that the atmospheres of the various plasma treatment chambers are not hermetically sealed off from one another.

14 Claims, 8 Drawing Sheets

(52) U.S. Cl.
CPC .. *H01J 37/32733* (2013.01); *H01J 37/32779* (2013.01); *H01J 37/32899* (2013.01); *H01L 21/6715* (2013.01); *H01L 21/6776* (2013.01); *H01L 21/67173* (2013.01)

(56) References Cited

U.S. PATENT DOCUMENTS

| | | |
|---|---|---|
| 2001/0021412 A1 | 9/2001 | Watanabe et al. |
| 2002/0015802 A1 | 2/2002 | Ozaki et al. |
| 2010/0260935 A1 | 10/2010 | Kato et al. |

FOREIGN PATENT DOCUMENTS

| | | |
|---|---|---|
| WO | 2013/131508 A1 | 9/2013 |
| WO | 2014/127847 A1 | 8/2014 |

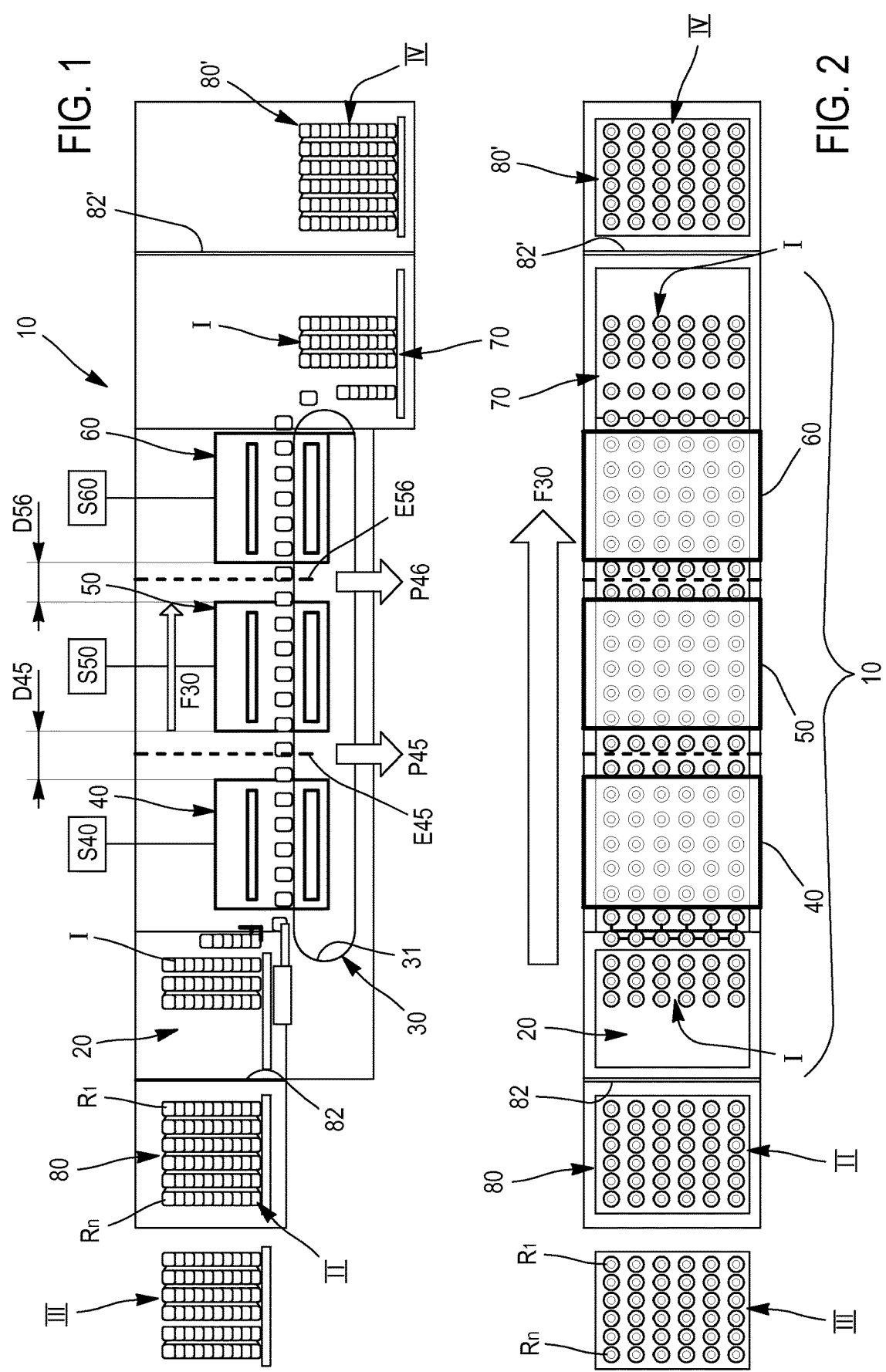

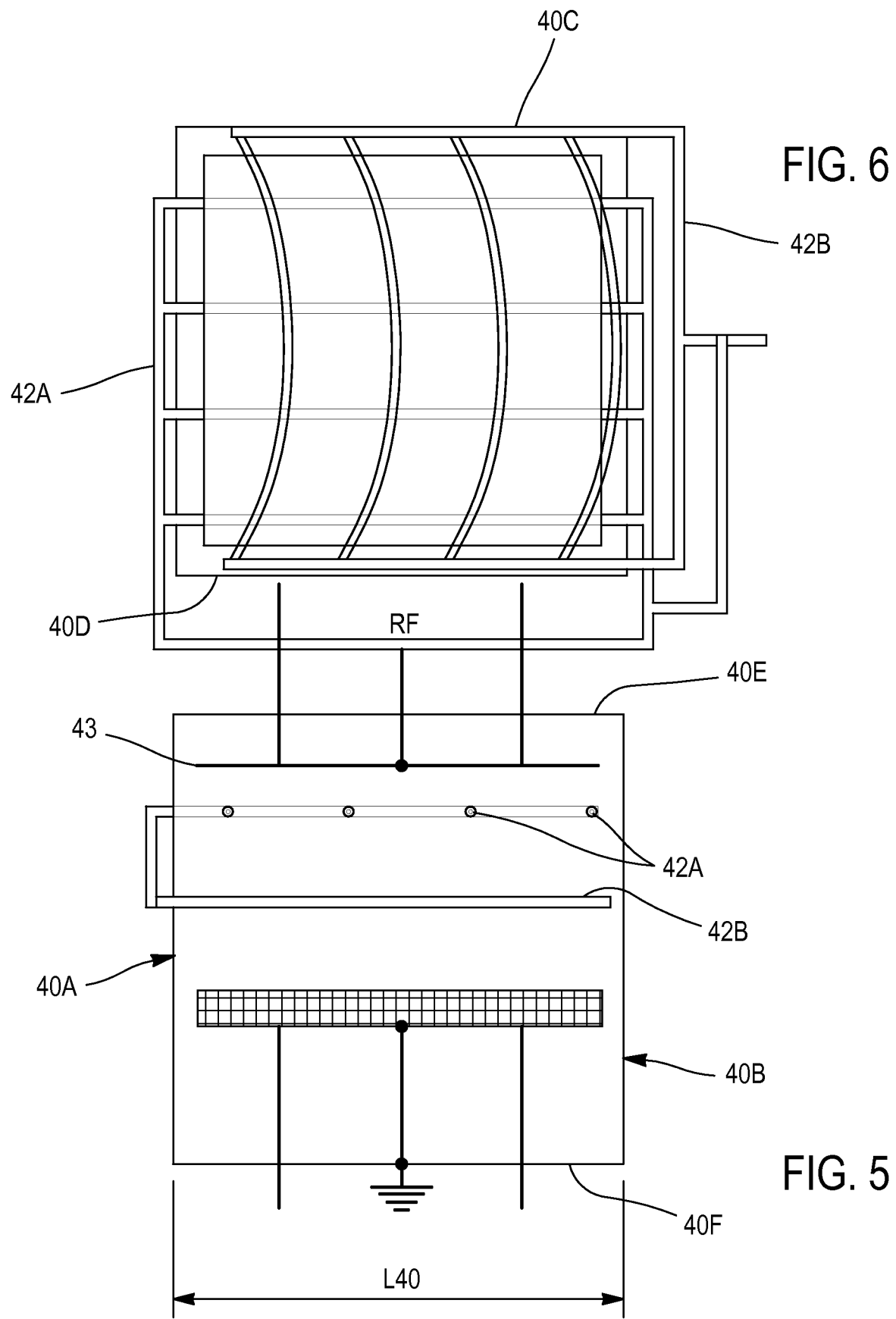

APPARATUS FOR TREATING OBJECTS WITH PLASMA, USE OF THIS APPARATUS AND METHOD OF USING THIS APPARATUS

TECHNICAL FIELD OF THE INVENTION

The invention relates to an industrial apparatus, for the purpose of treating objects with plasma. As a non-limiting example, the latter can be in particular hollow objects, that have an inside volume delimited by a wall that has an inner face and an outer face. Such objects among others are goblets, bowls, bottles, cups, trays, jars, tubes or industrial molds.

The invention relates more particularly to such an apparatus, wherein the aforementioned objects are subjected to at least two successive plasma treatments. The invention relates to all types of normal plasma treatment, among which mention can be made, in a non-limiting manner, of: cleaning, etching, activation, functionalization or deposition. By way of example, the objects treated can be covered with at least two successive layers. These two layers can be of the same nature, in which case the final deposition has a thickness that is greater than that obtained by a single deposition phase. These two layers can also be of different natures, in which case each step of treatment corresponds to a specific layer.

PRIOR ART

In conventional plasma treatment methods, two main ways are known, in order to carry out at least two successive treatments.

It is firstly known to treat the objects, inside a single plasma chamber. After placing objects in the chamber, the latter is placed under vacuum. A first gas mixture is then introduced, in order to generate a first type of plasma during a determined treatment time. In the case where the treatment is a deposition, the latter leads to the forming of the first layer, on the surface of the objects. Then the injection of the first reactive gases is stopped, which are removed. A second gas mixture is then introduced, within the same chamber, in order to deposit a second layer over the first layer formed beforehand. In a similar manner, at least one additional layer can be deposited over the two initial layers.

This first known type of treatment however has certain disadvantages. Indeed, it involves stopping the plasma between two successive steps of forming a basic layer, as well as the pumping of the chamber in order to remove the residual gases. This entails a substantial loss of time, in particular in the case of treating many parts. Moreover, the aforementioned pumping must be particularly forceful, in order to prevent any mixing between the successive gas mixtures. Mention will be made in particular, as a document that represents this prior art, of U.S. Pat. No. 8,336,488.

An alternative method is moreover known, wherein the objects to be treated stay in successive plasma chambers. Each chamber is closed by airlocks that make it possible to keep the composition of the gases homogeneous in each chamber, during the treatment. This method has disadvantages, in particular in the case of treatments of different durations, since the slowest treatment conditions the overall speed. Moreover, during the transfer from one chamber to the other, the plasmas must be stopped. The system of airlocks requires the use and the management of manipulators under vacuum which complicates the equipment. Mention will be made in particular, as documents that represent this state of the art, of EP 2 630 271 or DE 10 2008 019427.

It is further known, from U.S. Pat. No. 6,296,735, an apparatus for treating with plasma. The latter comprises an enclosure that can be put under vacuum, which encloses plasma chambers arranged under each other, according to one or two rows. In addition, a transporter makes it possible to displace the objects between an upstream storing zone and a downstream storing zone. This document does not make it possible to overcome the lacks, which are inherent with the two types of industrial solutions described hereinabove.

Finally a treatment device is known, from WO 2014/127847, comprising an enclosure under vacuum wherein are arranged two treatment chambers, separated by a partition. Each one of them is provided with at least one solid cathode, associated with a respective magnetron. The treatment is carried out via cathode sputtering, namely the atoms of the solid cathode are pulled off then sent to the surface of the substrate. This method however has notable disadvantages, in particular in that it is not practical for use for three-dimensional objects. In other terms, given that the distance between the cathode and the substrate is predefined, this method is limited to flat substrates.

In light of the above, an objective of this invention is to overcome, at least partially, the disadvantages of the prior art mentioned hereinabove.

Another objective of the invention is to propose an industrial apparatus that makes it possible to use, simply and effectively, at least two successive plasma treatments, in particular at least two different plasma treatments.

Another objective of the invention is to propose such an apparatus that allows for fast use, in such a way as to provide for the treatment of a high number of objects.

Another objective of the invention is to propose such an apparatus that authorized the treatment of objects of various shapes, in particular of three-dimensional objects.

Another objective of the invention is to propose such an apparatus that is accompanied by a flexible use, in such a way as to conveniently vary the nature of the treatments to which the objects are subjected.

Another objective of the invention is to propose such an apparatus, which has a relatively simple structure.

OBJECT OF THE INVENTION

According to the invention, the objectives hereinabove are achieved by means of an apparatus for treating the surface of objects with plasma, comprising an enclosure, means for placing this enclosure under vacuum, a zone for storing objects to be treated, which is called the upstream storing zone, a zone for storing treated objects, which is called the downstream storing zone, at least two plasma treatment chambers comprising means for injecting an active gas mixture, means for creating an electrical discharge and means for confining the plasma to the volume inside the chamber, means for transferring between the storing zones and the chambers, characterized in that the means for transferring are conveying means defining a conveying direction, in that the various chambers are placed one behind the other, in the conveying direction, and in that the atmospheres of the various plasma treatment chambers are not hermetically sealed off from one another.

According to other characteristics of the apparatus in accordance with the invention:

the means for injecting provided on the at least two chambers are connected to sources of a gas mixture (S40-S60), with at least two gas mixtures being of different natures; in other terms, at least one of the gas mixtures is different from the others. This characteristic is particularly advantageous, since it makes it possible to form at least two plasma deposits of different natures, on the surface of the same object.

at least one chamber has side walls, at least one side wall being marked with at least one notch (41; 141) allowing for the passage of the conveying means and of the objects to be treated, with the other side walls being solid.

the side wall marked with the notch is removably attached to the other walls of the chamber, and at least one replacement side wall is provided, marked with a notch of a different shape and/or dimension, suited to be attached to these other side walls.

the means for confining the plasma are of an electrophysical nature, with at least one chamber, in particular all of the chambers, having in particular walls connected to the ground.

the means for confining the plasma are of an electromagnetic nature, and include in particular at least one magnetron (90; 190) received in the volume inside the chamber.

the magnetron comprises at least one electromagnetic arrangement, of which each one comprises a central set of magnets (97, 97'), of which the polarity is turned in a first direction, as well as a peripheral set of magnets (96, 96'), surrounding the central set, of which the polarity is turned in the opposite direction.

the means for confining the plasma are of a physical nature.

the means for injecting include at least two tubular networks (42A, 42B; 142A; 142B), placed on either side of each object, in service, in order to carry out a deposition of plasma on two opposite faces of this object.

the means for creating an electrical discharge comprise at least one electrode (43; 143).

the walls facing two contiguous plasma chambers are separated and define an interstitial space (E45, E46), and means of suction (P45, P46) are provided in said interstitial space.

at least one among the upstream storing zone and the downstream storing zone comprises a meshed cage (120), in order to prevent any untimely putting into contact of the objects with the plasma.

at least one chamber comprises means for varying the characteristics of the plasma, in particular means (44) of displacement able to displace the means for creating a discharge and/or means (91) for displacing the magnetron.

the conveying direction is a longitudinal direction.

the conveying means (30) comprise an endless belt (31), extending in the longitudinal conveying direction.

the zone (20) for storing objects to be treated and the zone (70) for storing treated objects are provided in the vicinity of the two opposite ends of the endless belt.

the apparatus further comprises an adjoining chamber for placing under a vacuum (80) and/or an adjoining chamber for returning to ambient atmosphere (80'), separated with respect to the zone for storing objects to be treated (20) and to the zone for storing treated objects (70), via means of hermetic access (82, 82'), in particular via an airlock.

at least two plasma chambers that have different main dimensions, in the conveying direction, in such a way that the treatment times in these two chambers are different.

the conveying direction is a circular direction.

the conveying means comprise a rotating plate (130), that has a support surface, in order to maintain the objects to be treated.

the front walls of the chamber are marked with a segment (141A) of the passage of the plate, opening onto the inner side wall (140C), with this inner side wall being marked with a slit (141D) for the passage of the plate.

the upstream storing zone (120) and the downstream storing zone are confounded.

The objectives hereinabove are also achieved by means of a method of using the apparatus such as hereinabove, wherein the enclosure is placed under vacuum, a respective plasma is generated in each treatment chamber the conveying means are set into movement, in such a way as to cause the objects in the plasma chambers to circulate, from the upstream storing zone to the downstream storing zone.

According to other characteristics of the method in accordance with the invention:

the conveying means are set into movement according to the longitudinal direction, a first batch of objects is made to circulate in the plasma chambers from the upstream storing zone to the downstream storing zone, and the first batch is removed outside of the downstream storing zone and the next batch is admitted into the upstream storing zone, while still maintaining the enclosure under vacuum and while continuing to set the conveying means in movement.

the conveying means are set into movement according to the circular direction, and the rotation speed of these conveying means is made to vary during the residence of the objects in at least one chamber.

the conveying means are set into movement according to the circular direction, according to more than one revolution, in order to pass the objects at least twice inside at least one plasma treatment chamber.

different gas mixtures are injected, in at least two chambers, in such a way as to generate plasmas of different natures in these chambers.

hollow objects are treated, that have an inside volume delimited by a wall that has an inner face and an outer face.

The objectives hereinabove are finally achieved by means of a use of an apparatus such as hereinabove, for the treatment of hollow objects with plasma, that have an inside volume delimited by a wall that has an inner face and an outer face. Such a use is particularly advantageous, since it authorized the treatment of objects of extremely varied natures and shapes. This is to be compared with prior art, represented in particular by WO 2014/127847, which only allows for the treatment of flat substrates as explained hereinabove.

In terms of the invention, the active gas mixture is activated by an electric field. The molecules of activated gas will diffuse in the reaction volume to the surface of the substrate and will be attached by forming chemical bonds with the materials of the substrate. The components of the active gas mixture will therefore form all or a portion of the final deposition, in a chemical form that is different from their original form.

The method in accordance with the invention is therefore to be distinguished in particular from cathode sputtering, such as described in WO 2014/127847. Indeed, this cathode sputtering consists in spraying the material of the electrode in order to project it onto the surface of the substrate and form all or a portion of the final deposition. In WO 2014/127847, the gas mixture is used only to spray the material of the electrode, in such a way that it is not an active gas mixture in terms of this invention.

Providing conveying means, which make it possible to circulate the objects to be treated in the various plasma chambers, provides for continuous use. In particular, it is not necessary make use of a manipulation arm or similar between two successive plasma treatments, such as disclosed in particular in U.S. Pat. No. 6,296,735.

Moreover, given that the atmospheres of the various plasma treatment chambers are not hermetically sealed with respect to one another, the invention makes it possible to overcome the use of an airlock between these chambers. This therefore ensures a simplification and an acceleration in the use of this apparatus, which allows for high working speeds. In addition, the overall structure of the apparatus is lightened.

Finally the invention makes use of means that make it possible to confine the gas mixtures injected, as well as the plasmas generated. Any unacceptable mixture is as such avoided, on the one hand between the gas mixtures injected into adjacent chambers, on the other hand between the plasmas generated in these chambers. Consequently, the invention provides for the reliable use of a deposition making use of layers that are different from one another, on the same object.

The confining between the gas mixtures can be in particular of a physical nature. To this effect, it is possible in particular to provide for the creating of each chamber with walls that delimit a minimum leakage space for the gases.

The confining between the plasmas can firstly be of an electro-physical nature, for example by connecting the walls that delimit the chambers to the ground. As a substitution or as a supplement, it can be of an electromagnetic nature, thanks to for example the presence of a magnetron.

DESCRIPTION OF THE FIGURES

The invention shall now be described hereinafter, in reference to the annexed drawings, provided solely as non-limiting examples, wherein:

FIGS. 1 and 2 are views, respectively of the side and of the top, showing an apparatus in accordance with a first embodiment of the invention.

FIGS. 4 and 5 are views that show, respectively from the front and the side, the inside of a plasma chamber belonging to the apparatus of the preceding figures.

FIG. 6 is a top view showing this plasma chamber.

Figure 3:
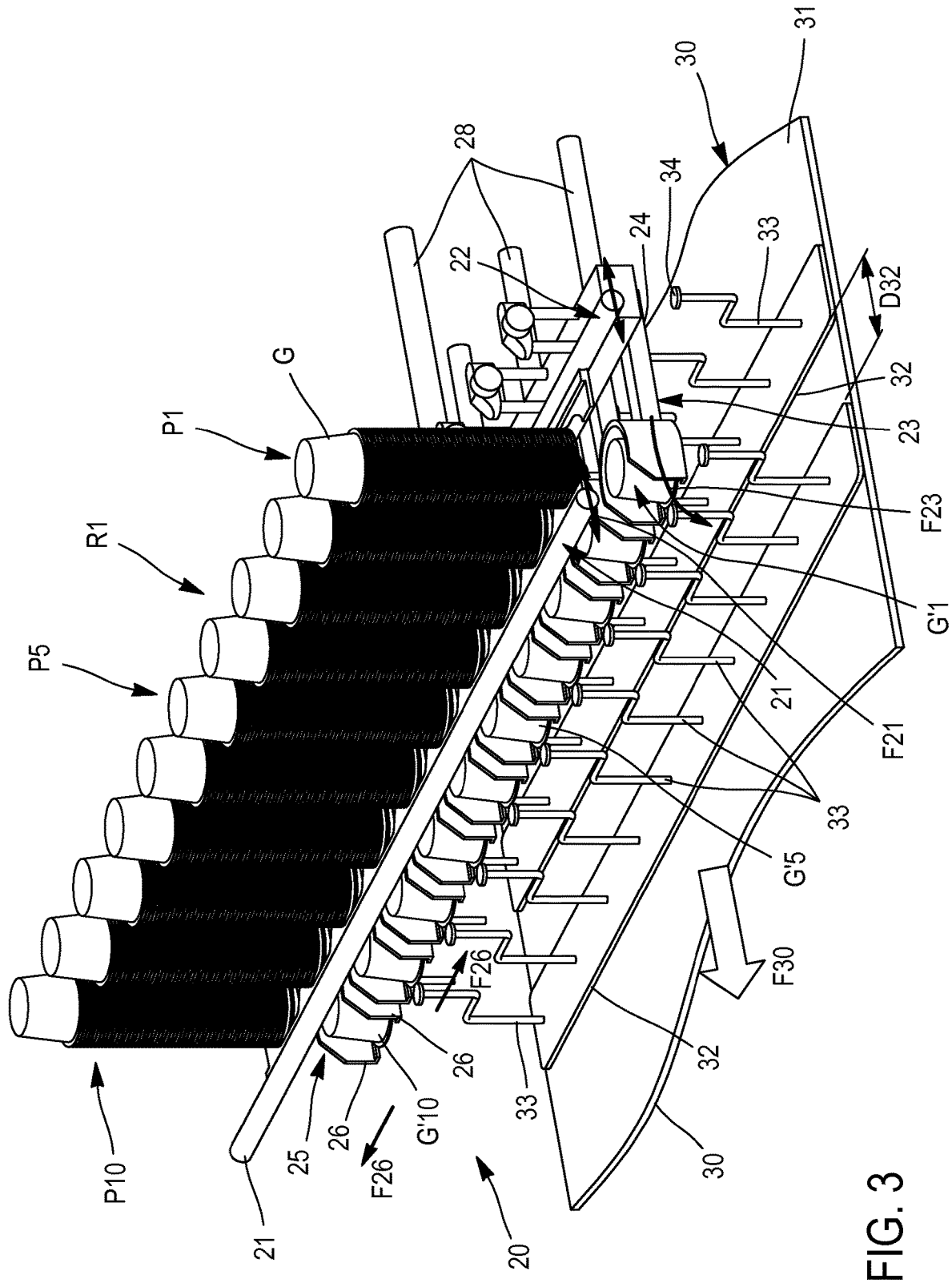
FIG. 3 is a view in perspective, showing means of unstacking that belong to the apparatus of FIGS. 1 and 2.
Figure 4:
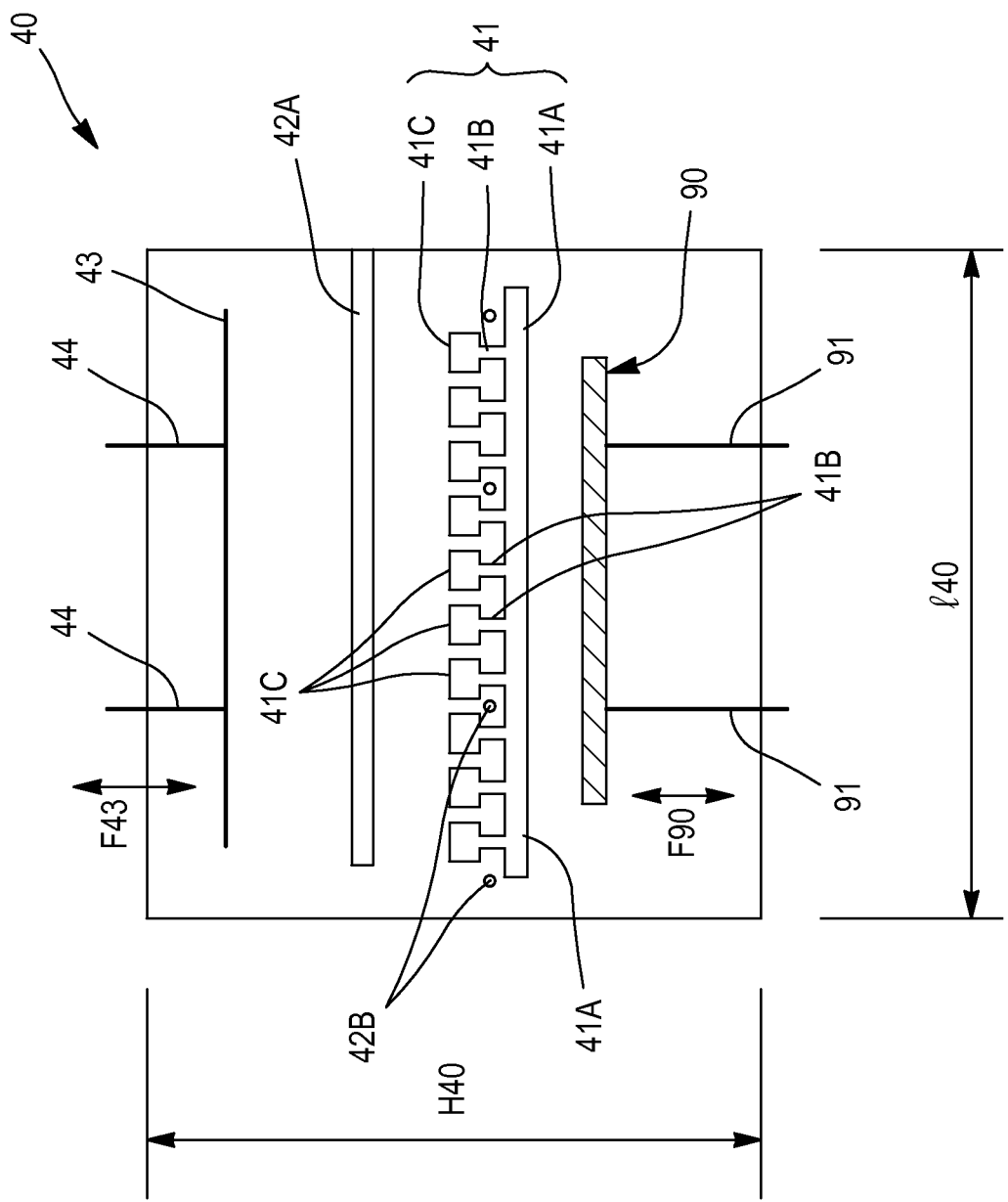

The following numerical references are used in this description:

| | |
|---|---|
| 10 Enclosure | 20 Unstacking station |
| G Goblets | P1 to P10 Stacks of objects |
| 21, 22 Unstacking bars | 23 Arm |
| 24 Body of 23 | 25 Head of 23 |
| 26 Wings of 25 | 28 Transmission elements |
| 30 Conveyor | 31 Conveyor belt |
| F30 Direction of conveying | 32 Cross members |
| 33 Supports | 34 Pad of 33 |
| D32 Distance between cross members | 40, 50, 60 Plasma chambers |
| L40 length of 40 | l40 width of 40 |
| H40 height of 40 | L50 length of 50 |
| L60 length of 60 | 40A, 40B Front walls of 40 |
| 40C, 40D Side walls of 40 | 40E Upper wall of 40 |
| 40F Lower wall of 40 | 41 Notch |
| 41A Horizontal segment of 41 | 41B Vertical segment of 41 |
| 41C Hole of 41 | 42A Upper tubular network |
| 42B Lower tubular network | S40, S50, S60 Gas sources |
| 43 Electrode | 44 Rods |
| F43 Displacement of 43 | 70 Stacking station |
| 80, 80' Adjoining chambers | 82, 82' Airlock |
| 90 Magnetron | 91 Rods |
| F90 Displacement of 90 | 92, 93 Plates |
| 94, 94' Peripheral grooves | 95, 95' Central grooves |
| 96, 96' Peripheral magnets | 97, 97' Central magnets |
| N, S Poles of 96 | L90 Length of 90 |
| 131 Width of 31 | D45, D56 Distances between chambers |
| E45, E56 Spaces between chambers | P45, P46 Means of pumping |
| I to IV batches of objects | R1 to Rn Rows of objects |
| 110 Enclosure | 111 Means for placing under vacuum |
| 112 Door | 120 Cage for storing |
| 130 Conveyor | 132 Rod |
| 140, 150 Chambers | 140A-140F walls of 140 |
| 141 Notch | 141A Horizontal segment of 141 |
| 141B Vertical segment of 141 | 141C Hole of 141 |
| 141D Slit | 142A, 142B Means for injecting |
| 143 Electrode | 190 Magnetron |

DETAILED DESCRIPTION

FIGS. 1 to 9 describe a first embodiment, wherein the objects to be treated are displaced linearly, in other terms according to a movement of translation. The apparatus in accordance with the invention first comprises an enclosure, designated as a whole by the reference 10. This enclosure, of elongated shape, is substantially closed and is advantageously constantly placed under vacuum, in service. To this effect it is provided with means for placing under vacuum, which shall be described in more detail in what follows.

The enclosure 10 has thin walls, made of a conductive material or not. A sufficiently resistant material will be chosen, in order to resist being placed under vacuum in service. This will be for example a metal material, such as stainless steel or aluminum, or glass. The dimensions of this enclosure are chosen according to the hourly quantity of objects to be treated. Solely for the purposes of information, its length is between 2 and 5 meters, its width is between 0.5 and 1.5 meters, while its height is between 1.5 and 2.5 meters.

The enclosure is provided with a station 20 for unstacking objects to be treated, a conveyor 30, three plasma chambers 40, 50 and 60, as well as a station 70 for stacking objects once they are treated. Finally there are, respectively upstream and downstream of the enclosure 10, two adjoining chambers 80 and 80' of which the structure and the function shall be detailed in what follows. These chambers communicate with the enclosure, via respective means of access 82 and 82'. The latter, which are of the airlock or similar type, can selectively create a seal between the enclosure and one or the other of the aforementioned adjoining chambers.

The station 20 is intended for the unstacking of the objects to be treated which are, in the example shown, goblets G. As shown in particular in FIG. 3, which shows the station 20 under a different angle with respect to FIGS. 1 and 2, these goblets are arranged according to several stacks P1 to P10 arranged next to one another, in such a way as to form rows arranged one behind the other. This station 20 first comprises two unstacking bars 21 and 22, that are mobile in translation according to a back-and-forth movement. The station further comprises an arm 23, that comprises an elongated body 24 and a retaining head 25 in the shape of a U. The wings 26 of this head 25 can be attached or, as in the example shown, be separated or mutually brought together.

The movements of the bars 21, 22 and of the arm 23, which will be detailed in what follows, are imparted by the motor means not shown. Advantageously, these motor means are located outside of the enclosure 10. Note that, in FIG. 3, certain elements of transmission 28 are shown, which are kinematically inserted between the motor means and the bars 21, 22 and the arm 23.

The conveyor 30 first comprises a conveyor belt 31, forming an endless loop that can be set into movement according to the main direction of the enclosure, via conventional motor means not shown. The arrow F30, which can be seen in FIGS. 1 and 2, materializes the longitudinal direction of conveying of this first embodiment. Moreover cross members 32, which can be seen in particular in FIG. 3, are distributed regularly along this belt. Each one of these cross members 32 is integral with supports 33, intended to support the objects during the treatment operations.

The shape and the dimensions of the supports 33 are suited to the objects to be treated. In the example shown, each support 33 globally has the shape of an S, by being provided with an end pad 34, providing satisfactory support to the goblet with which it cooperates. The distance D32 that separates two adjacent cross members is chosen according to the dimension of the goblets, so as in particular to prevent any untimely contact between the goblets of two adjacent rows.

The structure of the chamber 40 shall now be described, with the understanding that the structure of the other chambers 50 and 60 is similar. The chamber 40, of parallelepiped shape, has for the purposes of information the following dimensions:

length L40 between 0.1 and 1.5 meter
width l40 between 0.1 and 1.5 meter
height h40 between 0.05 and 1.0 meter.

It is conceived that, since the endless belt 31 scrolls at a constant speed, the length L40 will influence the residence time of the goblets in the chamber 40 and, because of this, on the duration of the treatment phase used in this chamber. Consequently, as long as the lengths of chambers L40, L50 and L60 are different from one another, treatment phases of different durations can be carried out in these chambers.

The chamber 40 is delimited by six walls, namely front 40A and rear 40B front walls, two side walls 40C and 40D, as well as upper 40E and lower 40F walls. These walls, of which the thickness is for example between 0.1 and 1.0 meter, are made from a conductive material, such as stainless steel, and are connected to the ground. The chamber is attached against the walls of the enclosure thanks to any suitable means, not shown.

The side walls 40C, 40D, upper wall 40E and lower wall 40F are preferably solid. However, each frontal wall 40A, 40B is marked with a respective notch 41, intended for the passage of the belt, supports and goblets. To this effect, each notch is comprised of a horizontal segment 41A cooperating with the belt, a plurality of vertical segments 41B, of which each one cooperates with a respective support, as well as a plurality of holes 41C, of which each one cooperates with a respective goblet.

Each front notch is suited to the dimensions of the belt, of the supports and of the goblets, in that it authorizes the passage of these elements while still arranging an interstitial space that is as small as possible. This makes it possible to confine the volume inside the plasma chamber, so as to limit leakage of gas mixture outside of this volume.

It is conceived that a given geometry of notches is not necessarily well suited, if the shape and/or the dimensions of the belt and/or of the supports and/or of the objects to be treated is modified. It is therefore advantageous to provide that the front walls 40A and 40B be removably attached, by any suitable means, to the other walls of the chamber. These front walls can also be replaced, where applicable, by at least one set of additional front walls, wherein are arranged different notches with regard to their shape and/or their dimensions.

The chamber 40 further comprises means for injecting an active gas mixture, susceptible for forming a plasma in service. Advantageously, these means for injecting comprise a first upper tubular network 42A, placed over the goblets, as well as a second lower tubular network 42B, placed under the goblets. These two networks make it possible to homogenize the distribution of the gases, in order to treat the two opposite faces of the goblets, respectively outer and inner, during the same step of treatment.

These networks are supplied by a source S40 of gas mixture, provided for example outside of the enclosure. The passage of the various tubes, through the walls of each chamber and, where applicable, through the walls of the enclosure, is carried out in a sealed manner. Note also S50 and S60 the sources of gas mixtures, intended to be injected into the chambers 50 and 60. In order to allow for treatments of different natures in the chambers 40, 50 and 60, the gas mixtures coming from sources S40 to S60 are also different.

The sources S40 to S60 are shown in FIG. 1, with the source S40 also being shown diagrammatically in FIG. 6. On the other hand, in FIG. 1, the various tubular networks for injection, communicating with these sources, are not shown.

The chamber 40 further comprises a flat metal electrode, designated as a whole by the reference 43. This electrode, which can be cooled by any suitable means, not shown, is connected to the potential of a generator not shown, of the conventional type. The counter-electrode is formed by another metal plate, not shown, placed under the endless belt 31 of the conveyor. It is electrically insulated from the walls of the enclosure and can be left at the floating potential, or be connected to the generator or to the ground.

The electrode 43 is supported by insulating suspension rods 44, which are slidably mounted with respect to the upper wall of the chamber. In these conditions, the height of this electrode can be modified, according to the arrow F43, in order to vary the characteristics of the plasma. The electrodes of the three plasma chambers are connected to different generators, which makes it possible to conduct treatments at different pressure and power levels. Moreover, these generators can advantageously be synchronized, which makes it possible to prevent electromagnetic disturbances.

In the lower portion of the chamber 40, namely under the belt 31, a magnetron is provided designated as a whole by the reference 90. This magnetron is supported by insulating suspension rods 91, similar to those 44, which are slidably mounted with respect to the lower wall of the chamber. In these conditions, the height of this magnetron can be modified, according to the arrow F90, in order to vary the characteristics of the plasma.

Figure 8:
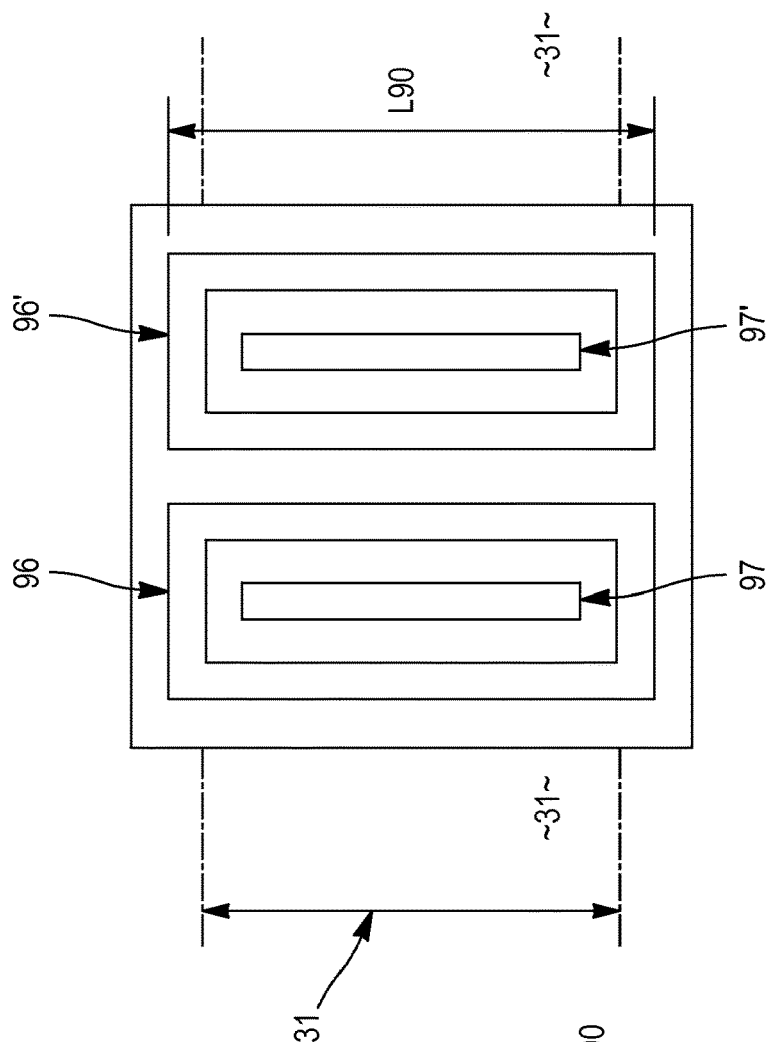
FIGS. 7 and 8 are views respectively in perspective and from above, showing a magnetron that belongs to the apparatus of the preceding figures.
Figure 7:
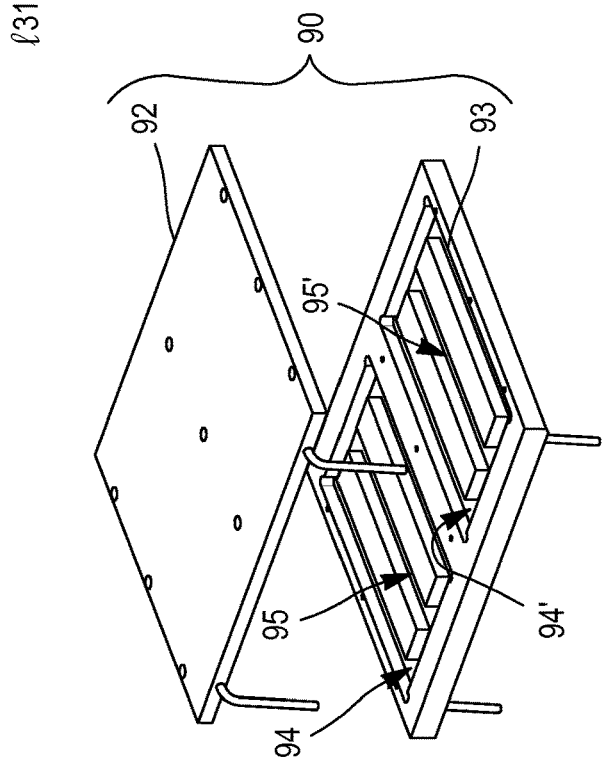
Figure 10:
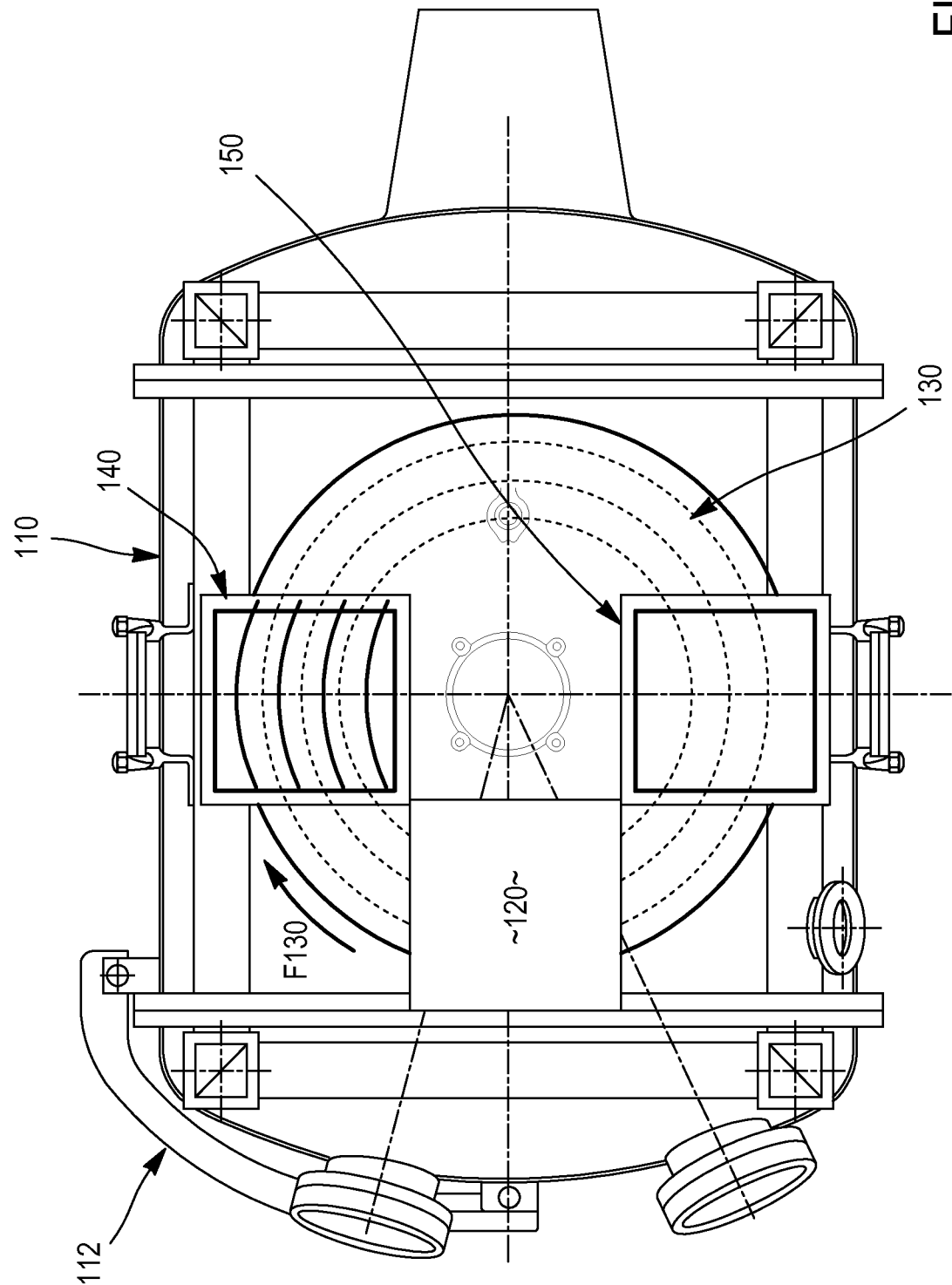
FIGS. 10 and 11 are views, respectively of the top and at the end, showing an apparatus in accordance with a second embodiment of the invention.
Figure 11:
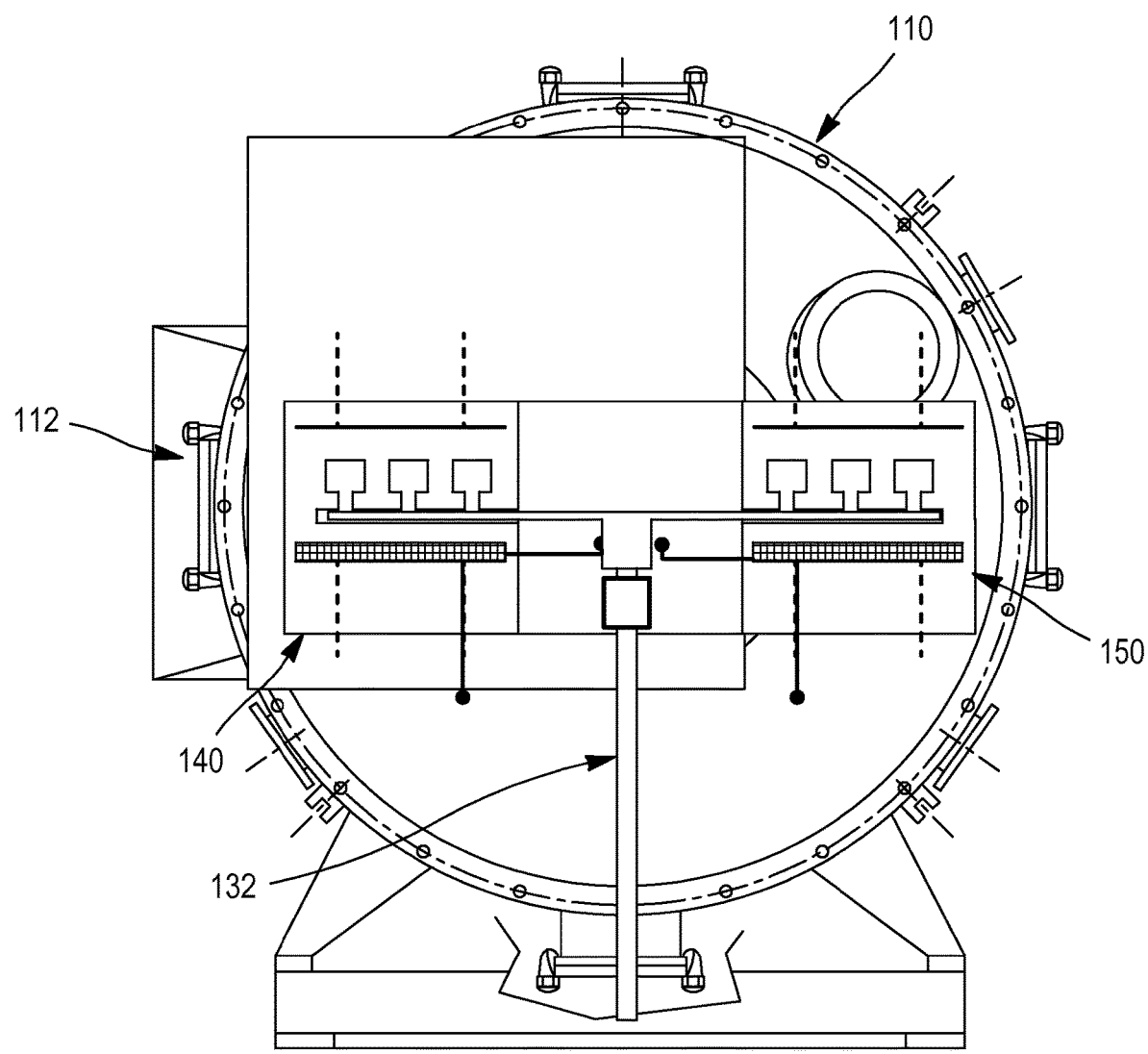
Figure 12:
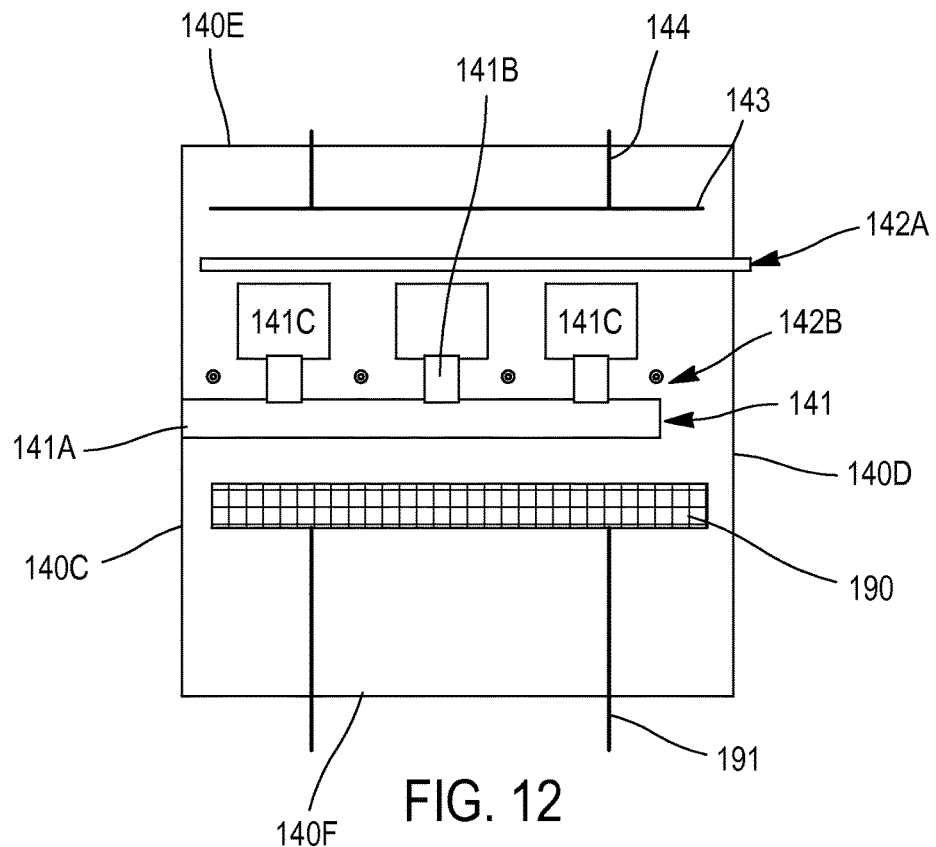
FIGS. 12 and 13 are views showing, respectively from the front and the side, the inside of a plasma chamber that belongs to the apparatus of FIGS. 10 and 11.
Figure 13:
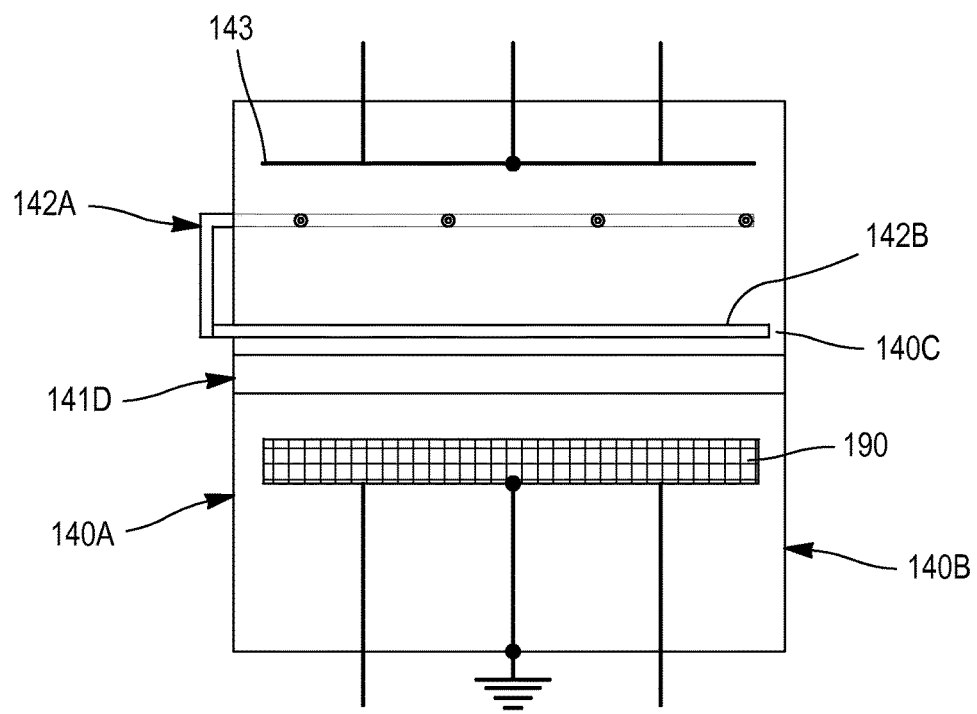

This magnetron can be associated with a cooling circuit, not shown. Advantageously it is electrically insulated and can be placed at the floating potential, or be connected to the generator or to the ground. In the example shown, as shown in FIGS. 7 and 8, the magnetron 90 comprises two metal plates 92 and 93, which may be cooled. One 92 of these plates is solid, while the other 93 is hollow with different grooves. There are two identical grooves 94 and 94', in the shape of a rectangular loop, inside of each is marked a respective straight groove 95 and 95'.

Figure 9:
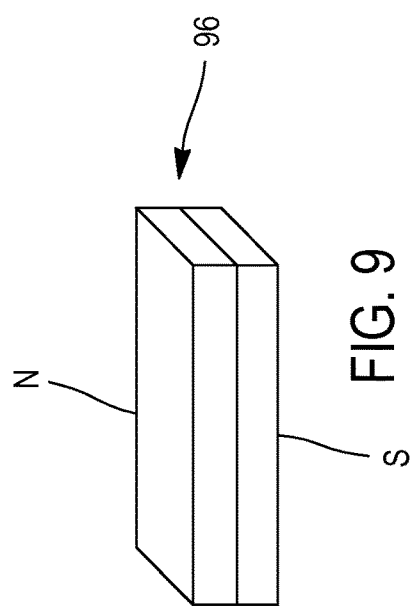
FIG. 9 is a perspective view of a magnet that belongs to the magnetron of FIGS. 7 and 8.

Each peripheral groove 94 and 94' receives a series of magnets 96 and 96', placed one behind the other according to a closed loop. FIG. 9 shows one of these magnets 96, of which the North pole N is turned upwards. Moreover, a second series of magnets 97, 97' is placed in a respective central groove 95, 95'. The South pole of these inner magnets 97, 97' is turned upwards, namely that their polarity is opposite than of the peripheral magnets 96, 96'.

The magnetron makes it possible to confine, in service, the plasma generated in a given chamber and, because of this, to reduce the contamination with the plasmas produced in the other chambers of the apparatus. This confining is also carried out thanks to the presence of the walls of the chamber, which are connected to the ground. Note that this confining is used, without the atmosphere of each chamber being rendered hermetically sealed, in particular via an airlock system.

In the example shown, the magnetron comprises two adjacent and identical electromagnetic arrangements, of which each one is formed by a series of inner magnets 97 or 97', surrounded by a series of peripheral magnets 96 or 96' extending as a closed loop. As an alternative, it can be provided that the magnetron is formed by a single arrangement of this type, or that it comprises a number of arrangements greater than two.

The use of a magnetron is also advantageous, in that it increases ion bombardment, which induces a densification of the layers during the deposition phase. This use also increases the speed of the growth and the adhesion between the nanometric layer and the substrate to be treated, which can be carried out in various materials such as plastic, metal, glass or ceramic.

The magnets comprising the magnetron can be of different forces and dimensions, according to the operating configurations. Electromagnets can also be used, instead of permanent magnets. In reference to FIG. 8, it is advantageous that the length L90 of the magnetron, namely the longest distance of each peripheral series of magnets 96 or 96', be greater than the width 131 of the endless belt. This makes it possible to improve the technical effect of the magnetron.

D45 and D56 denote the distances between two contiguous chambers, that separate their adjacent walls. Typically, each one of these distances is between 5 and 20 centimeters. E45 and E56 denote the interstitial spaces, delimited between each pair of chambers. Advantageously, means for pumping P45 and P46 are placed in each one of these spaces, which makes it possible to prevent any untimely contact between the gas fractions that can escape outside of the various chambers. These means of pumping P45 and P46 also form, advantageously, the means for placing the enclosure 10 under vacuum.

The use of the apparatus, described hereinabove in reference to FIGS. 1 to 9, shall now be explained in what follows.

It is supposed that various batches of goblets must be treated by means of this apparatus. Each batch I to IV is formed of rows R1 to Rn, of which each one is formed of different stacks with each one next to the others, as shown in FIG. 3.

For the purpose of treating any first batch, a prior preparation phase is carried out. To this effect the enclosure is firstly placed under vacuum, at a pressure typically less than $1.10^{-3}$ mbar. The various gas mixtures are then introduced into each plasma chamber, from the sources S40 to S60, in order to confer a stable pressure, typically between $10^{-2}$ and $5.10^{-1}$ mbar, inside each chamber. A stabilization time is then observed, typically between 1 and 10 seconds. Each plasma is then generated, in a manner known per se, in a respective chamber. After a stabilization time typically of a few seconds, the endless belt is set into movement, then is not advantageously stopped during the rest of the use.

In reference to FIGS. 1 and 2, it is supposed that a first batch I is in the process of treatment in the enclosure, another batch lot II is on hold in the upstream chamber 80, an additional batch III is on hold outside, while a last batch IV has just been treated and is in the downstream chamber 80'. The successive rows of the batch I are firstly unstacked, in order to admit them onto the endless belt 31.

To this effect, the bars 21 and 22 are set into movement (arrow F21) so as to authorize the falling via gravity of a single goblet G'1 to G'10 located at the bottom of each stack. This goblet is then taken by the head 25 of the arm 23, which is set into movement (arrow F23), on the one hand in horizontal translation at the same speed as the belt 31 and, on the other hand, in translation downwards in the direction of this belt. When each head is in the vicinity of a respective support, it releases the goblet that it was retaining by separating the wings 26 (arrows F26).

Each goblet then rests on a respective support, then is displaced in translation along different chambers. It then undergoes three suitable treatments, of the same nature or of different natures as was explained hereinabove. Given that the speed of the belt is advantageously maintained constant, the time for each individual treatment can be adjusted according to the length of the chambers.

After having been subjected to these successive treatments, the goblets of the batch I are again arranged in the form of stacks, in a manner known per se, in the station 70. During the treatment of this batch I, the batch II is placed in the upstream chamber 80, within which it is placed under vacuum, while the batch IV is placed in the downstream chamber 80', within which it is released to ambient atmosphere. Note that, during these respective phases of placing under vacuum and of releasing to ambient atmosphere, the means of separation 82 and 82' are activated, in such a way that there is a seal between the volumes inside the enclosure 10 and the two adjoining chambers 80, 80'.

Once all of the goblets of the batch I are stacked again in the downstream storing zone 70, the batch lot IV is removed outside of the downstream adjoining chamber 80'. The latter is placed under vacuum, just as the upstream adjoining chamber 80. The batch I is then transferred from the enclosure to this downstream chamber 80', and the following batch II is admitted into the enclosure, from the upstream chamber 80.

The seal is then reestablished between the enclosure and these two adjoining chambers, then the batch II is treated in a manner that is identical to that described hereinabove for the batch I. During the treatment of the batch II, the batch III is admitted into the upstream chamber and the latter is placed under vacuum, while the batch I in the downstream chamber is released to the ambient atmosphere.

Advantageously, the endless belt is continuously set into movement and the enclosure is constantly placed under vacuum, without a risk of malfunction. Indeed, when the enclosure is in communication with the adjoining chambers, the latter are under vacuum. In addition, when these adjoining chambers communicate with the outside, for the transfer of the batches treated/to be treated, these chambers are then hermetically sealed in relation to the enclosure.

FIGS. 10 to 13 describe a second embodiment, wherein the objects to be treated are displaced according to a movement of rotation. In these FIGS. 10 to 13, the mechanical elements similar to those of FIGS. 1 to 9 are assigned therein the same reference numbers, increased by 100.

The apparatus in accordance with this second embodiment first comprises an enclosure 110, provided with means for placing under a vacuum, shown diagrammatically and assigned the reference 111. This enclosure 110 has thin walls, similar to those of the enclosure 10. It is provided with a door 112, allowing access to its inside volume. This enclosure 110, which is of cylindrical shape, has a shape that is less elongated than the enclosure 10. Solely for the purposes of information, its length is between 0.5 and 2.0 meters, although its diameter is between 0.5 and 1.5 meters.

The enclosure is provided with a storing station 120, with a conveyor 130, as well as two plasma chambers 140 and 150. The conveyor is formed by a plate, made for example in the form of an aluminum disk. In a non-limiting manner, the thickness of this disk is between 0.5 and 2.0 centimeters, in particular in the neighborhood of 1 centimeter, while its diameter is between 40 and 140 centimeters, in particular in the neighborhood of 80 centimeters.

The storing station 120 is advantageously carried out in the form of a meshed cage, connected to the ground. This arrangement makes it possible to protect the objects stored in the cage, with regards to a plasma escaping in a substantial quantity from one of the chambers 140, 150. Consequently, the treatment time of the objects is perfectly controlled, since it is limited to the residence time inside the plasma chambers.

The plate 130 is supported by a metal rod 132, which itself is connected to a motor not shown, placed outside the enclosure. The plate can therefore enter into rotation about the main axis of the rod, namely that it can typically pivot about this vertical axis. The arrow F130, visible in FIG. 10, materializes the direction of circular conveyance of this second embodiment. Such as shall be detailed in what follows, the motor has a variable speed, in such a way that the speed of the plate 130 can be modulated between each chamber in order to modify the treatment time.

Advantageously, this plate is electrically insulated thanks to an insulating support, not shown, inserted between the plate and the rod. Two brushes also not shown, made for example from carbon or similar, make it possible to connect the plate indifferently to the ground or to the return of the generator that is provided on each plasma chamber. As in the first embodiment, the plate is provided with supports not shown, in order to retain the objects to be treated. In the case where these supports are conductors, they can be designed to serve as antennas and modify the distribution of the electrical field in the vicinity of the objects.

The chambers 140 and 150, which are substantially identical, are globally similar to those 40 to 60 of the first embodiment. As such the chamber 140 has six walls, of which the walls that are respectively lateral 140D, upper 140E and lower 140F are solid. Each front wall 140A, 140B is marked with a respective notch 141, intended for the passage of the plate, supports and objects.

The shape of the notch 141 differs from that 41 of the first embodiment, in that the horizontal segment 141A, cooperating with the plate, opens onto the inner side wall 140C of the chamber 140. This wall 140C is moreover marked with a slit 141D, authorizing the displacement of the plate, which extends between the opposite front faces. The vertical segments 141B and the holes 141C of the notch 141 are on the other hand similar to the elements 41B and 41C, described in particular in reference to FIG. 4.

As in the first embodiment, each notch authorizes the passage of the plate, supports and objects to be treated, while still arranging an interstitial space that is as small as possible. It can be provided that the front walls 140A and 140B be removably attached, by any suitable means, to the other walls of the chamber. Moreover each chamber 140, 150 is provided, as in the first embodiment, with means for injecting 142A and 142B, an electrode 143 and a magnetron 190.

In service, the objects to be treated are firstly placed on the plate, then a prior phase of preparation is used, in a way similar to what was described hereinabove for the first embodiment. As such, the enclosure is placed under vacuum, then the various gas mixtures are admitted, a stabilization time is observed and each plasma is generated in a respective chamber. After a time of stabilization, the plate is driven in rotation, in such a way that the objects to be treated circulate in each chamber, in order to undergo the desired treatment.

Contrary to the first embodiment, the treatment time within a given chamber can be modified by adjusting, not the dimensions of the chamber, but the rotation speed. As such, if the plate is slowed, its residence time is extended and the treatment time is increased.

In addition, it can be provided to pivot the plate according to more than one revolution, in particular at least two full revolutions. In this way, the objects supported by this plate are subjected to several successive treatments in the same chamber. From one revolution to the other, the nature of the gas mixture injected can also be modified. For example, a pretreatment mixture can firstly be injected into the chamber 140 for the purpose of the first revolution of the objects then, during the following rotation, subject the latter to another gas mixture within this same chamber, so as to recoat the surface of these objects.

Finally, as soon as the objects have been subjected to the last step of treatment provided, they are again directed into the meshed cage of the station 120, which prevents them from being untimely subjected to a plasma. Each plasma is then stopped, before removing the residual gas mixtures. Finally, the volume inside the enclosure is released to atmospheric pressure, in order to extract the objects treated.

The invention claimed is:

1. An apparatus for treating a surface of an object with plasma, comprising:
 an enclosure,
 a means for placing the enclosure under vacuum,
 an upstream storing zone for storing the object to be treated,
 a downstream storing zone for storing a treated object,
 at least two plasma treatment chambers comprising a means for injecting an active gas mixture, a means for creating an electric discharge and a means for confining the plasma to a volume inside at least one chamber of the at least two plasma treatment chambers, a means for transferring between the storing zones and the at least two plasma treatment chambers, wherein the means for transferring is a conveying means defining a conveying direction, wherein the at least two plasma treatment chambers are placed in a line in the conveying direction, and wherein atmospheres of the at least two plasma treatment chambers are not hermetically sealed off from one another.

2. The apparatus according to claim 1, further comprising sources of gas mixture, with the means for injecting provided on the at least two plasma treatment chambers being connected to said sources of gas mixture, with at least two gas mixtures being of different natures.

3. The apparatus according to claim 1, wherein the means for confining the plasma is of an electro-physical nature, with at least one chamber of the at least two plasma treatment chambers having walls connected to the ground.

4. The apparatus according to claim 1, wherein the means for confining the plasma is of an electromagnetic nature, and comprise at least one magnetron received in the volume inside at least one chamber of the at least two plasma treatment chambers.

5. The apparatus according to claim 4, wherein the magnetron comprises at least one electromagnetic arrangement comprising a central set of magnets having a polarity turned in a first direction, and a peripheral set of magnets surrounding the central set of magnets, wherein the peripheral set of magnets has a polarity turned in an opposite direction to the first direction.

6. The apparatus according to claim 1, wherein the means for confining the plasma is of a physical nature.

7. The apparatus according to claim 1, wherein the means for injecting comprises at least two tubular networks, placed on either side of the object, in service, in order to create a plasma deposit on two opposite faces of the object.

8. The apparatus according to claim 1, wherein at least one chamber of the at least two plasma treatment chambers comprises a means of varying characteristics of the plasma.

9. The apparatus according to claim 1, wherein at least one chamber of the at least two plasma treatment chambers has side walls, wherein at least one side wall is marked with at least one notch allowing for a passage of the conveying means and of the objects to be treated, with other side walls being solid.

10. The apparatus according to claim 1, wherein the at least two plasma treatment chambers have different main dimensions, in the conveying direction, in such a way that the treatment times in the at least two plasma treatment chambers are different.

11. The apparatus according to claim 4, wherein the means of varying characteristics of the plasma is a means of displacement able to displace the means for creating a discharge and/or means for displacing the at least one magnetron.

12. The apparatus according to claim 3, wherein all of the at least two plasma treatment chambers have walls connected to the ground.

13. The apparatus according to claim 1, wherein components of the active gas mixture are adapted to form all or part of the plasma deposited on the surface of the object.

14. The apparatus according to claim 13, wherein the components of the active gas mixture that form all or part of the plasma deposited on the surface of the object are in a chemical form that is different from an original form of the components.

* * * * *